(12) United States Patent
Dang et al.

(10) Patent No.: US 9,893,047 B2
(45) Date of Patent: Feb. 13, 2018

(54) MANUFACTURE OF WAFER—PANEL DIE PACKAGE ASSEMBLY TECHNOLOGY

(71) Applicant: INTERNATIONAL BUSINESS MACHINES CORPORATION, Armonk, NY (US)

(72) Inventors: Bing Dang, Chappaqua, NY (US); John Knickerbocker, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/490,377

(22) Filed: Apr. 18, 2017

(65) Prior Publication Data
US 2017/0221872 A1    Aug. 3, 2017

Related U.S. Application Data

(62) Division of application No. 14/977,068, filed on Dec. 21, 2015, now Pat. No. 9,691,747.

(51) Int. Cl.
*H01L 21/66* (2006.01)
*H01L 25/00* (2006.01)
(Continued)

(52) U.S. Cl.
CPC ............ *H01L 25/50* (2013.01); *H01L 21/561* (2013.01); *H01L 21/563* (2013.01); *H01L 21/6835* (2013.01); *H01L 21/6836* (2013.01); *H01L 21/78* (2013.01); *H01L 22/20* (2013.01); *H01L 24/32* (2013.01); *H01L 24/96* (2013.01); *H01L 24/97* (2013.01); *H01L 25/0657* (2013.01); *H01L 25/167* (2013.01); *H01L 25/18* (2013.01); *H01L 25/043* (2013.01); *H01L 25/074* (2013.01); *H01L 25/0756* (2013.01); *H01L 25/117* (2013.01); *H01L 2221/68322* (2013.01); *H01L 2221/68327* (2013.01); *H01L 2221/68359* (2013.01); *H01L 2221/68363* (2013.01); *H01L 2221/68381* (2013.01); *H01L 2223/6677* (2013.01); *H01L 2224/32145* (2013.01);
(Continued)

(58) Field of Classification Search
CPC ..... H01L 21/6835; H01L 25/50; H01L 21/78; H01L 25/0657; H01L 21/563; H01L 22/20; H01L 24/96; H01L 2221/68359; H01L 2221/68327; H01L 25/043; H01L 25/0652; H01L 25/071; H01L 25/074; H01L 25/0756; H01L 25/117; H01L 21/6836; H01L 21/561; H01L 25/18; H01L 25/167; H01L 24/97; H01L 24/32; H01L 2221/68363; H01L 2221/68381; H01L 2224/95001; H01L 2224/95144; H01L 2224/95146; H01L 2224/32145; H01L 2221/68322
See application file for complete search history.

(56) References Cited

U.S. PATENT DOCUMENTS

2002/0074668 A1*  6/2002  Hofstee .............. H01L 23/3677
                                                         257/777
2009/0023243 A1*  1/2009  Koyanagi ............ H01L 21/568
                                                         438/107

* cited by examiner

*Primary Examiner* — Thanh T Nguyen
(74) *Attorney, Agent, or Firm* — Cantor Colburn LLP; Louis Percello

(57) ABSTRACT

Disclosed is a process, structure, equipment and apparatus directed to a low cost, high volume approach for the assembly of ultra small die to three-dimensional (3D) or 2.5D semiconductor packages.

20 Claims, 3 Drawing Sheets

(51) Int. Cl.
  *H01L 25/065*  (2006.01)
  *H01L 23/00*  (2006.01)
  *H01L 21/78*  (2006.01)
  *H01L 21/56*  (2006.01)
  *H01L 21/683*  (2006.01)
  *H01L 25/16*  (2006.01)
  *H01L 25/18*  (2006.01)
  *H01L 25/075*  (2006.01)
  *H01L 25/11*  (2006.01)
  *H01L 25/04*  (2014.01)
  *H01L 25/07*  (2006.01)

(52) U.S. Cl.
  CPC ............... *H01L 2224/95001* (2013.01); *H01L 2224/95144* (2013.01); *H01L 2224/95146* (2013.01)

MANUFACTURE OF WAFER—PANEL DIE PACKAGE ASSEMBLY TECHNOLOGY

PRIORITY

This application is a divisional of U.S. Non-Provisional application Ser. No. 14/977,068, entitled "MANUFACTURE OF WAFER—PANEL DIE TO PACKAGE ASSEMBLY TECHNOLOGY, which is incorporated herein by reference in its entirety.

BACKGROUND

The present invention generally relates to a low cost, high volume processes for the assembly of ultra small die to three-dimensional (3D) or 2.5D semiconductor packages, and to structures, equipment, and apparatuses used in the processes.

There is a current need in the industry for both low cost and high volume ultra small die to package assembly manufacturing processes. These package assemblies can be used for applications where miniaturization of electronic devices is desired such as for mobile, IOT, wearable, smart phone, bio-compatible interface low power, light weight electronic systems, and the like.

In 3D chip stacks, chips or dice are layered on top of one another in a three-dimensional stack with electrical interconnects between layers. This configuration has many benefits, such as providing a designer with the ability to place an increased number of chips in a given two-dimensional area with an increased amount of electrical communications between them. In 2.5D packages, an interconnect substrate known as an interposer is used to provide high density interconnects. The interposer is placed between the substrate and the dice, where the interposer contains through silicon vias (TSVs) connecting the metallization layers on its upper and lower surfaces.

SUMMARY

In one embodiment, a method comprises preparing in high volume a plurality of chip package assemblies using an area array wafer to wafer die stack assembly process to prepare the chip package components in high volume.

In another embodiment, a method comprises preparing in high volume a plurality of chip package assemblies using an area array wafer to panel die stack assembly process to prepare the chip package components in high volume; wherein the assembly process optionally comprises bonding a handle substrate to a device wafer; processing the device wafer to form a processed device wafer comprising a plurality of dies used to prepare the die stack assembly; and debonding the processed device wafer from the handle substrate.

In yet another embodiment, a method comprises preparing in high volume a plurality of chip package assemblies using an area array wafer to wafer die stack assembly process or area array wafer to panel die stack assembly process to prepare the chip package components in high volume; wherein the assembly process comprises bonding a handle substrate to a device wafer; processing the device wafer to form a processed device wafer comprising a plurality of dies used to prepare the die stack assembly; and debonding the processed device wafer from the handle substrate.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
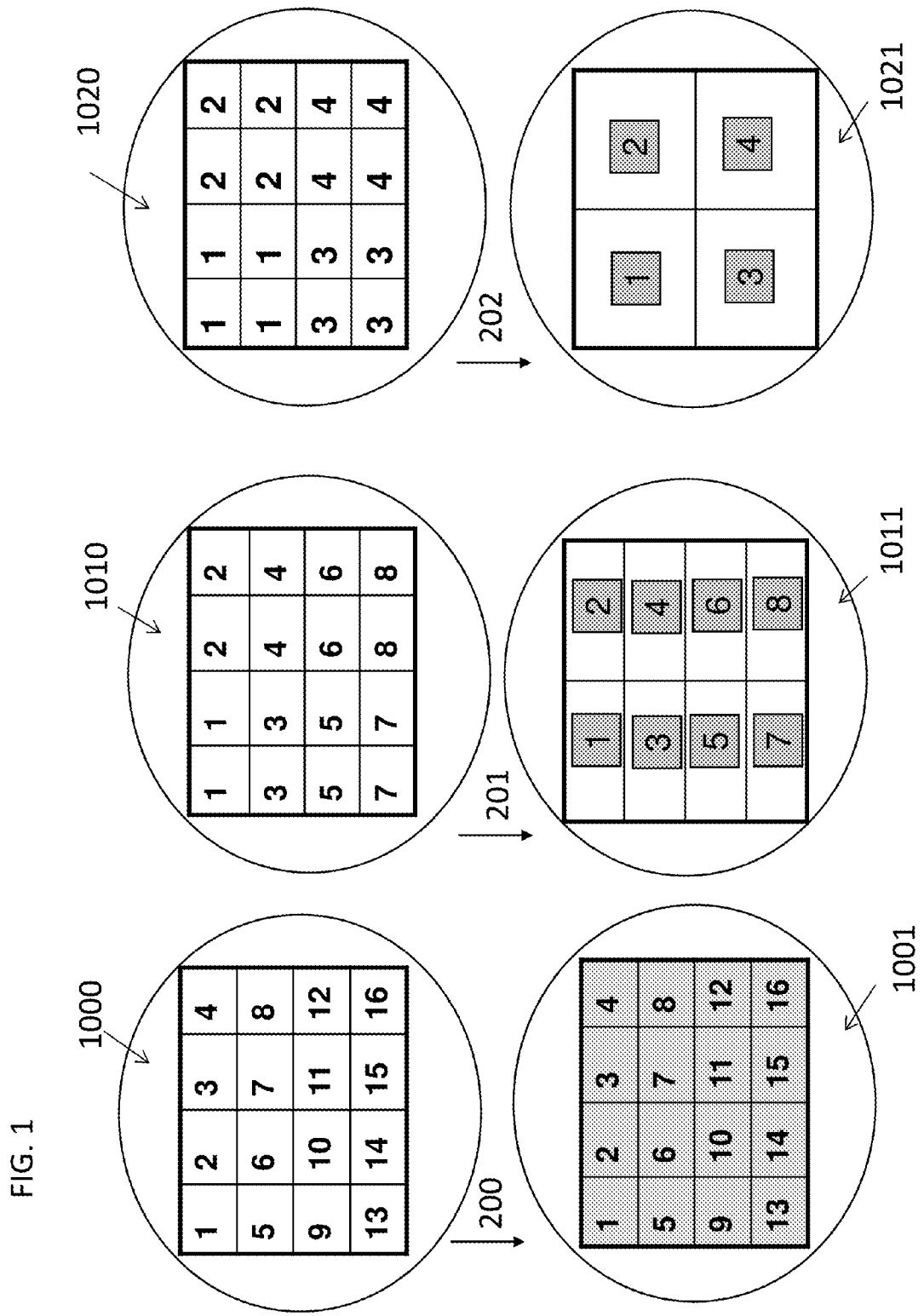
FIG. 1 is a schematic of an assembly die on handle wafer to packages on wafer processing for high volume and small size die and package assemblies.

As stated above, the present invention relates to low cost, high volume processes for the assembly of ultra small die to three-dimensional (3D) or 2.5D semiconductor packages, and to structures, equipment, and apparatuses used in the processes. More specifically, the high volume, low cost and precision integration method for electronic packaging, assembly and test of ultra small die uses wafer level and/or panel level processing of one or more die or sub-components. By leveraging wafer level and/or panel level processing to create a large number of components at the same time (thousands, hundreds of thousands, millions, or more), the cost of building and assembly of 3D and 2.5D packages is significantly reduced. The process involves the creation of multiple components at the wafer or panel level that can be used to prepare a package using pick and place of one or more components, e.g. hundreds, thousands, etc., at the same time. As many components can be prepared at the same time, the cost of operating is spread out and the overall cost for each component is reduced.

There remains a need in the art for both ultra low cost and ultra high volume manufacturing processes to prepare ultra small die to 3D and 2.5D package assemblies.

The instant methods, structures, equipment, an apparatuses can be used in the assembly of ultra small die to packages by area array wafer to wafer integration, area array wafer to panel integration, linear die to package integration, or self assembly of die to package integration by means of self assembly processing including magnetic, surface tension or other alternative means at high volume and low cost.

The process for assembly of packages can be multiple die on wafer to packages on wafer; multiple die on wafer to substrates on panel; or multiple die per each of one or more wafers to packages on one or more wafers or panels.

Wafer to wafer assembly or wafer to panel assembly can be achieved with an integer of linear or area die relative to package size. For example, the dies can be efficiently assembled to their corresponding packages such as by joining each of four adjacent die to packages of four times the die size in four sequential joining steps of wafers to another wafer of package or such as four wafers of die to corresponding four times the panel size of wafers.

In an embodiment, a method comprises preparing in high volume a plurality of chip package assemblies using an area array wafer to wafer die stack assembly process or area array wafer to panel die stack assembly process to prepare the chip package components in high volume. Within this embodiment, the assembly process can comprise bonding a handle substrate to a device wafer; processing the device wafer to form a processed device wafer comprising a plurality of dies used to prepare the die stack assembly; and debonding the processed device wafer from the handle substrate.

Bond and debond technology to handle large area, single or multiple components by use of thick handle wafers or handle panels to support thinned die, thin wafers, thin glass (touch screen, etc.) or other fragile components during processing, assembly and then release are used to minimize damage and to achieve high yield and low cost. As used herein, handle wafers and handle panels are collectively referred to as "handle substrates".

Besides the advantages set out above for the use of a handle substrate, the handle substrate can be used for temporary co-planarity management of thin die and wafers in the joining process. One or more handle substrates can be used in the die/wafer/panel joining step including any number of steps for bonding and debonding of the handle substrate as necessary. In one embodiment, conducting wafer to wafer permanent bonding using oxide or polymer adhesive and post via, through-silicon via (TSV) interconnection in one or more die layers in the stack. The wafer can be silicon on insulator (SOI) or a standard wafer such as Si, III-V compound semiconductor (such as GaAs or GaN) or alternative wafer materials.

In general, bonding is the act of attaching a device wafer, which is to become a layer in a 3D or 2.5D stack, to a handle substrate (e.g., a handle wafer or handle panel), so that the device wafer can be processed without damage. The device wafer can undergo any number of processes, for example, addition of wiring, pads, and joining metallurgy, thinning for example to expose the through silicon via (TSV) metal of blind vias etched from the top surface, and the like.

In general debonding is the act of removing the processed device wafer from the handle substrate, whether a handle wafer or handle panel, so that the processed device wafer may be further processed or added to a 3D or 2.5D stack.

One approach for temporary device wafer bonding/debonding involves the use of an adhesive layer placed directly between the device wafer and the handle substrate. The bonding may include a physical bringing together of the device wafer and the handle substrate under controlled heat and pressure in a vacuum environment such as offered in any one of a number of commercial bonding tools. The device wafer attached to the handle substrate can undergo various processing steps described herein. When the processing of the device wafer is complete, the device wafer may be released from the handle substrate by various techniques such as by exposing the device wafer-handle substrate pair to chemical solvents delivered by perforations in the handle substrate, by mechanical peeling from an edge initiation point, or by heating the adhesive so that it may loosen to the point where the device wafer/handle substrate may be separated by sheering.

Other exemplary temporary bonding/debonding processes involve the use of an adhesive, the use of a release layer and adhesive, or use of an integrated release layer and adhesive in one for the bonding process, and the use of a laser for the debonding process. The type of lasers used in the debonding process depends upon the type of release layer or integrated release layer and adhesive employed. Exemplary lasers include a 266 nanometer, a 308 nanometer, a 355 nanometer, or a 512 nanometer laser. Such bonding/debonding processes include those described in U.S. Pat. No. 9,029,238 to Andry et al.; U.S. Pat. No. 8,679,280 to Dang et al.; U.S. Pat. No. 8,419,895 to Dang et al.; and U.S. Pat. No. 8,388,782 to Andry et al.; the relevant portions of each patent are incorporated by reference herein.

In an embodiment, the bonding/debonding processes include applying a release layer strongly absorbent of ultraviolet light to a transparent handle substrate substantially transparent to visible light. An adhesive layer, that is distinct from the release layer, is applied between a device wafer and the transparent handle substrate having the release layer applied thereon. The device wafer is bonded to the transparent handle substrate using the adhesive layer. The device wafer is processed while it is bonded to the transparent handle substrate. After the desired processing has been conducted on the device wafer, the release layer is then ablated by irradiating the release layer through the transparent handle substrate using laser radiation and the processed device wafer is removed from the transparent handle substrate. Such bonding/debonding processes are set out in U.S. Pat. No. 9,029,238 to Andry et al.

In another embodiment of bonding/debonding processes, the adhesive is a thermoset polymer and/or a polyimide-based polymer, the handle substrate comprises a material that is transparent in a wavelength range of about 193 nanometers (nm) to about 400 nm and the debonding occurs by ablating the adhesive through the handle substrate using a laser, wherein a wavelength of the laser is selected based on the transparency of the handle substrate material.

The handle substrate, whether a handle wafer or handle panel, can be made from glass, silicon, or other appropriate material having the necessary transparency when a laser debonding process is employed. In an embodiment, the handle wafer or handle panel includes one or more holes, specifically a plurality of holes. The holes can be used to permit gas exchange or access for reducing solder or metal surface oxide such as with formic acid treatment or plasma treatment. In an embodiment, the holes coincide with dicing for die in wafer level processing.

In an embodiment to prepare a device, such as a touch screen device, the process comprises bonding one or more of a thinned glass panel to a handle substrate, processing the thinned glass panel, such as by component attachment and assembly, liquid crystal fill, sealing, or other assembly steps, and then debonding the processed panel from the handle substrate. The thinned glass panel can have a thickness of <400 micrometers. The thinned glass panel can be a touch screen panel. The bonding/debonding steps can be conducted as described herein. In one embodiment, the bonding step uses a release layer and adhesive, or integrated release layer and adhesive in one, and the debonding is by means of laser ablation, using an appropriate laser such as 266 nanometer, 308 nanometer, 355 nanometer, or 512 nanometer laser.

The device wafer bonded to the handle substrate may be subject to any number of desired processing steps. Processing may include, for example, patterning, etching, thinning, etc. until the device wafer has achieved its desired state. Before debonding, the circuitry of the device wafer may be inspected. Inspection of the device circuitry may be performed to ensure that the device wafer has been properly processed. Inspection may be optically performed, for example, using a high quality microscope or other imaging modality.

In an embodiment, laser release of a device wafer from a handle substrate is performed before or after one or more steps including reflow soldering or thermal compression bonding, formic acid or alternate no clean flux, transient liquid phase solder to intermetallic compounds (IMC) joining with micropillar interconnect structures, or a combination thereof.

In the wafer to wafer or wafer to panel assembly process, suitable joining processes include thermal compression bonding, reflow soldering, and the like. In an embodiment, a handle substrate may be used to hold a device wafer for wafer to wafer or wafer to panel assembly and reflow with or without added weight or pressure. The device wafer may optionally comprise one or more holes for gas exchange during the reflow process that can be at least in part aligned with holes in the handle substrate or at the edges, or a combination thereof for gas access to interconnections on the device wafer. In an optional embodiment, pins may be used to aid in the alignment of wafer to wafer and notch during the reflow process. Ambient gas, for example nitrogen, hydrogen, formic acid, or a combination there compatible with the metallurgy used for the interconnection can be used. In an optional step, weight can be applied to aid interconnection joining yield.

In an embodiment, a handle substrate may be used for thermal compression bonding of wafer to wafer with application of temperature and pressure and controlled ambient, for example nitrogen, hydrogen, formic acid, or alternate compatible ambient, to ensure high joining yield based on the interconnection employed. The handle substrate may be a handle wafer or handle panel including silicon, glass, or other alternative material.

In an embodiment, assembly can be achieved with fixtures and reflow and use of formic acid as gaseous flux. Plasma can be used prior to reflow to remove surface oxides. Weight or pressure may be applied during reflow and fixture pins can be used to hold wafers in alignment during reflow for die on wafer to packages on wafer assembly, or die on wafer to packages on panel assembly, or multiple die on multiple wafers to packages on panel processing.

The joining process can further comprise conducting precision alignment and bond at high volume even for ultra small size by use of area array wafer level processing, area array panel level processing, or a combination thereof.

The process can comprise performing multiple reflow cycles to add multiple dies to a package on wafer or package on panel per reflow.

The process can comprise adding one or more layers of die using a handle substrate on one side and a wafer or a panel on the other side for a die or a die stack assembly to a package.

Wafer fabrication and preparation of wafers includes wafer fabrication processes for circuits, TSV if needed, and wiring. In an embodiment, a handle substrate, such as a handle wafer or handle panel made of glass or silicon or other alternative material, can be used to hold a device wafer flat for thinning and backside processing of the die.

The process can further comprise performing die singulation during joining at the wafer level option using a suitable process, for example etching, reactive ion etching (ME) including deep RIE, laser processing, mechanical dicing such as saw sizing, a plasma process, or a combination thereof. In an embodiment, the process further comprises using a laser process or an alternative dicing process between die stacks to cut through adhesive of the die stacks for singulation and for stress reduction.

In an embodiment, a handle substrate, such as a handle wafer or handle panel made of glass or silicon or other alternative material can be used to hold a device wafer for singulation of die.

In one embodiment for the process of making low I/O assemblies, the process comprises putting thinned and diced die from a dicing tape by laser cut into strips and conducting chip or component shooting for low cost assembly.

One or more handle substrates may be used in the process to prepare die stacks and packages where after an assembly step such as a reflow or a thermal compression bonding step, the die can be released post bonding by laser, the released die can be chemically cleaned and dried. The resulting die can be subject to a repeat process, for example using reflow or thermal compression bonding, if there are more die per package, and/or repeated for other components, such as batteries or other sub components, until the package is completed. The die undergoing one or more subsequent processing steps can be bonded to a handle substrate as needed.

The process may further comprise using stress management layers such as compressive or tensile layers to create improved co-planarity of die, wafer, bonded die, bonded wafer, bonded die with handle substrate, bonded wafer with handle substrate during processing or for wafer stacks or die stacks post any handle substrate removal.

The process can further comprise a step of testing for good dies and using known good dies for the package assemblies. Such testing can occur at the wafer level or panel level, or a combination thereof. The process can further comprise a step of testing dies post assembly into packages. This embodiment can include the option to test or test and repair a die, multiple dies, a subcomponent, multiple subcomponents, or a combination thereof that have been assembled to packages to determine known good assemblies. The process may further comprise performing a self test repair of a die or a die stack post package assembly, for example by e-fuse technology.

In one embodiment, the process may further include testing the dies to find and remove defective dies or repair defective dies. For example, a defective die can be removed from a handle substrate using laser debonding as described herein, or repaired by design, laser, etc. And individual die can be placed and joined if justified by economics of die, package, and subcomponent and assembly costs.

The process can further include the option for overmolding or encapsulation of a stacked die on packages. Alternatively, or in addition, a heat sink may be attached to a die, a stacked die, or an integrated package.

The process can further include a step of underfilling a die stack to packages for product reliability. The step can be pre-applied underfill or post assembly underfill followed by a curing step. Processes such as capillary underfill or vacuum assisted underfill can be used to join each layer up to all layers in a die stack or a wafer stack in one or more steps. When a pre-applied underfill process is used, the pre-applied underfill can be used to join each layer in the stack during bonding. For post underfill, the die or multiple die and sub components can be underfilled after assembly integration.

The die stacks that are prepared can comprise any number and type of component as homogeneous or heterogeneous stacks, for example, one or more memory die, one or more logic die, one or more Field Programmable Gate Array (FPGA) die, one or more network die, one or more antenna layers, one or more network or cross bar layers, one or more photonic layers, and the like, or a combination thereof.

In an embodiment, the process can include ultra small component placement such as reel component chip shooting, e.g. for coarse interconnection pitch or a component with two connections). The ultra small die can be placed by means of self assembly such as using magnetic, surface tension, or alternate technology.

In an embodiment, a wafer level structure comprises at least one thinned, singulated die bonded to a handle substrate. Within this embodiment, the handle substrate comprises a plurality of holes which can coincide with dicing for die in wafer level processing. The plurality of holes can be used to permit gas exchange or access for reducing solder or metal surface oxide such as with formic acid or plasma treatment In an embodiment, an interconnection structure leverages micropillar interconnects such as with Cu or Ni and solder such as with SnAg, SnAgCu and pad or Cu to Cu pad structure or alternative metallic bonding or conductive adhesive material. A process for making the interconnection structure includes use of plating and/or injection molded solder, or solder screening to create pillars, under bump metallurgy, solder and corresponding contact pad or copper pillar and copper pad or alternative metallurgical or conductive adhesive for I/O. In the process using preapplied adhesive, the adhesive can be applied by spin on with cure or film coating with application of heat and pressure. The I/O structures can be created prior to or after singulation of die on the handle substrate or partial process before and after.

In an embodiment, the process uses NiFe-based Ball-Limiting-Metallurgy (BLM) for microbumps at the bottom of a die stack for die stack to package connection such that solder bump, solder pillar/Cu structure and solder barrier layers such as Ni and or NiFe or Cr or Co are able to maintain some solder in the interface post bonding to permit potential stack rework post joining and test.

In an embodiment, a bonded interconnection structure can be one or more die or sub-components to a package with above joined interconnections and use of pre-applied or post bonding adhesive between the die and package.

The assemblies, processes, and apparatus are now described in detail with accompanying figures. Like reference numerals refer to like elements across different embodiments. The figures are not to scale.

FIG. 1 is a schematic of an assembly of die on handle wafer to packages on wafer processing for high volume and small size die and package assemblies. The example is described in the figure at low die/wafer ratio, but in practice can be 100 times, 100,000 times, 1,000,000 times or more of the number of dies shown. In FIG. 1, the process (200) is described where a first single wafer, referred to as a handle wafer (1000), comprising multiple dies, here sixteen in number, is used to prepare sixteen corresponding packages (or dies) on a second, single wafer (1001). All of the dies on the single handle wafer (1000) are designated for the second, single wafer (1001). The dies of the handle wafer (1000) can be the same or different.

In an alternative embodiment, in FIG. 1 process (201), a single handle wafer (1010) containing sixteen dies is used to prepare eight corresponding packages on two different second wafers, each second wafer (1011) having the same type and order of packages as the other second wafer. In this embodiment, the dies of a single handle wafer (1010) are shared between two second wafers. In the process, the first die (1) of handle wafer (1010) is transferred and bonded to one of the second wafers (1011) and the second die (1) is transferred and bonded to the other second wafer (1011). Likewise, the first die (2) of handle wafer (1010) is transferred and bonded to one of the second wafers (1011) and the second die (2) is transferred and bonded to the other second wafer (1011), etc. The dies of the handle wafer (1010) can be the same or different, although each die pair (1,1; 2,2; etc.) are the same.

In an alternative embodiment, in FIG. 1 process (202), a single handle wafer (1020) containing sixteen dies is used to prepare four corresponding packages on four different second wafers, each second wafer (1021) having the same type and order of packages as the three other second wafers. In this embodiment, the dies of a single handle wafer (1020) are shared between four second wafers. The dies of the handle wafer (1020) can be the same or different, although each die quadruplet (1,1,1,1; 2,2,2,2; etc.) are the same.

Figure 2:
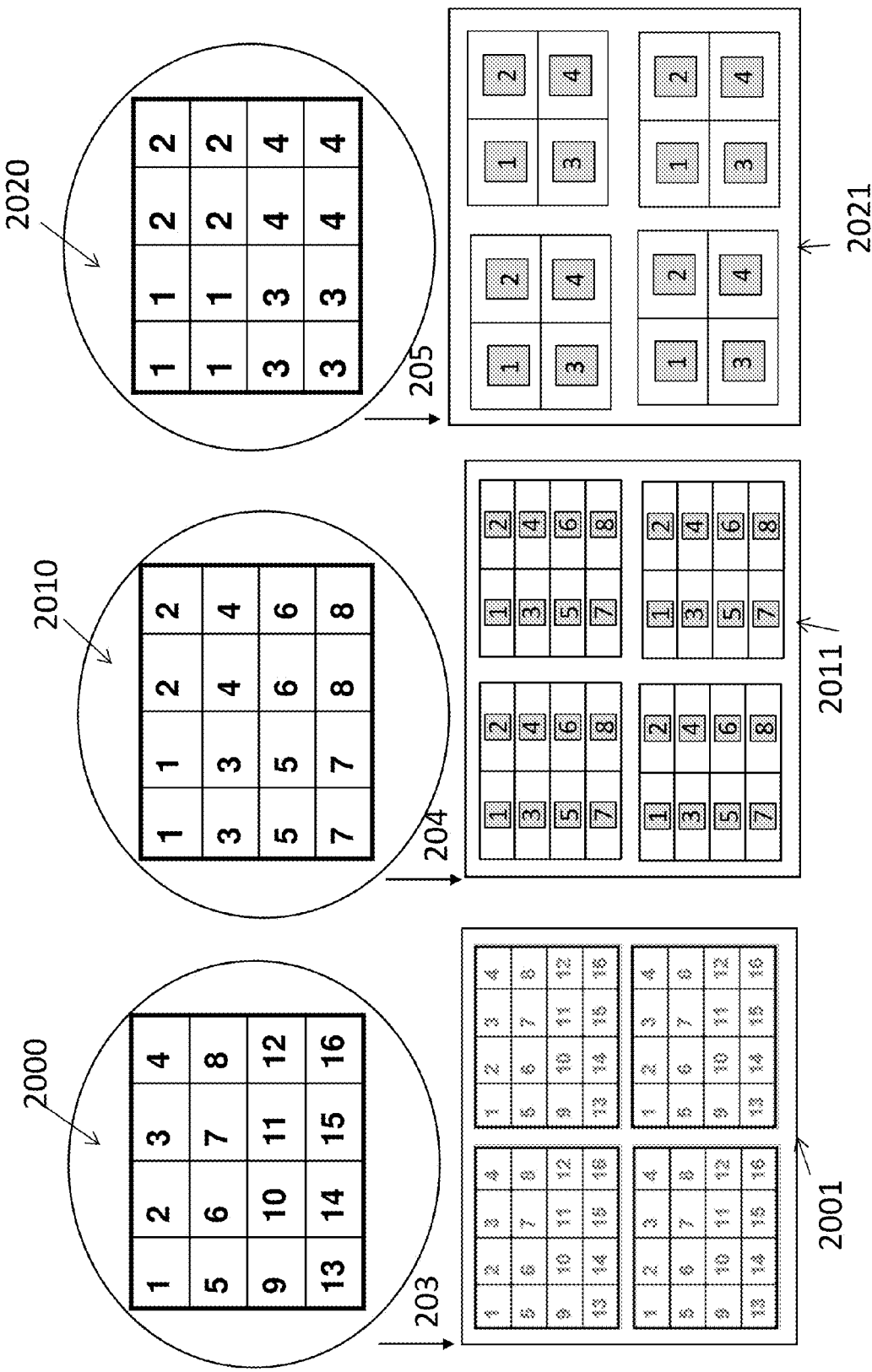
FIG. 2 is a schematic of an assembly die on handle wafer to packages on panel processing for high volume and small size die and package assemblies.

FIG. 2 is a schematic of an assembly die on handle wafer to packages on panel processing for high volume and small size die and package assemblies. The example is described in the figure at low die/wafer ratio, but in practice can be 100 times, 100,000 times, 1,000,000 times or more of the number of dies shown. In FIG. 2, the process (203) is described where four identical types of handle wafers (2000, only a single wafer is shown in the figure), comprising multiple dies, here sixteen in number, are used to prepare sixty-four packages on a single panel (1001). The dies of the handle wafer (2000) can be the same or different.

In an alternative embodiment, in FIG. 2 process (204), two identical types of handle wafers (2010), (only a single wafer is shown in the figure) containing sixteen dies is used to prepare thirty-two packages on a single panel (2011). The dies of the handle wafer (2010) can be the same or different, although each die pair (1,1; 2,2; etc.) are the same.

In an alternative embodiment, in FIG. 1 process (205), a single handle wafer (2020) containing sixteen dies is used to prepare sixteen packages on a single panel (2021). All of the dies on the single handle wafer (2020) are designated for the single panel (2021). The dies of the handle wafer (2020) can be the same or different, although each die quadruplet (1,1,1,1; 2,2,2,2; etc.) are the same.

The assembly processes as set out in FIG. 1 or FIG. 2 can be carried out using self-assembly of dies onto magnetic alignment pads such as Ni array for I/O and wafer or panel magnetic reference pads, or can be surface tension self-alignment, etc.

Figure 3:
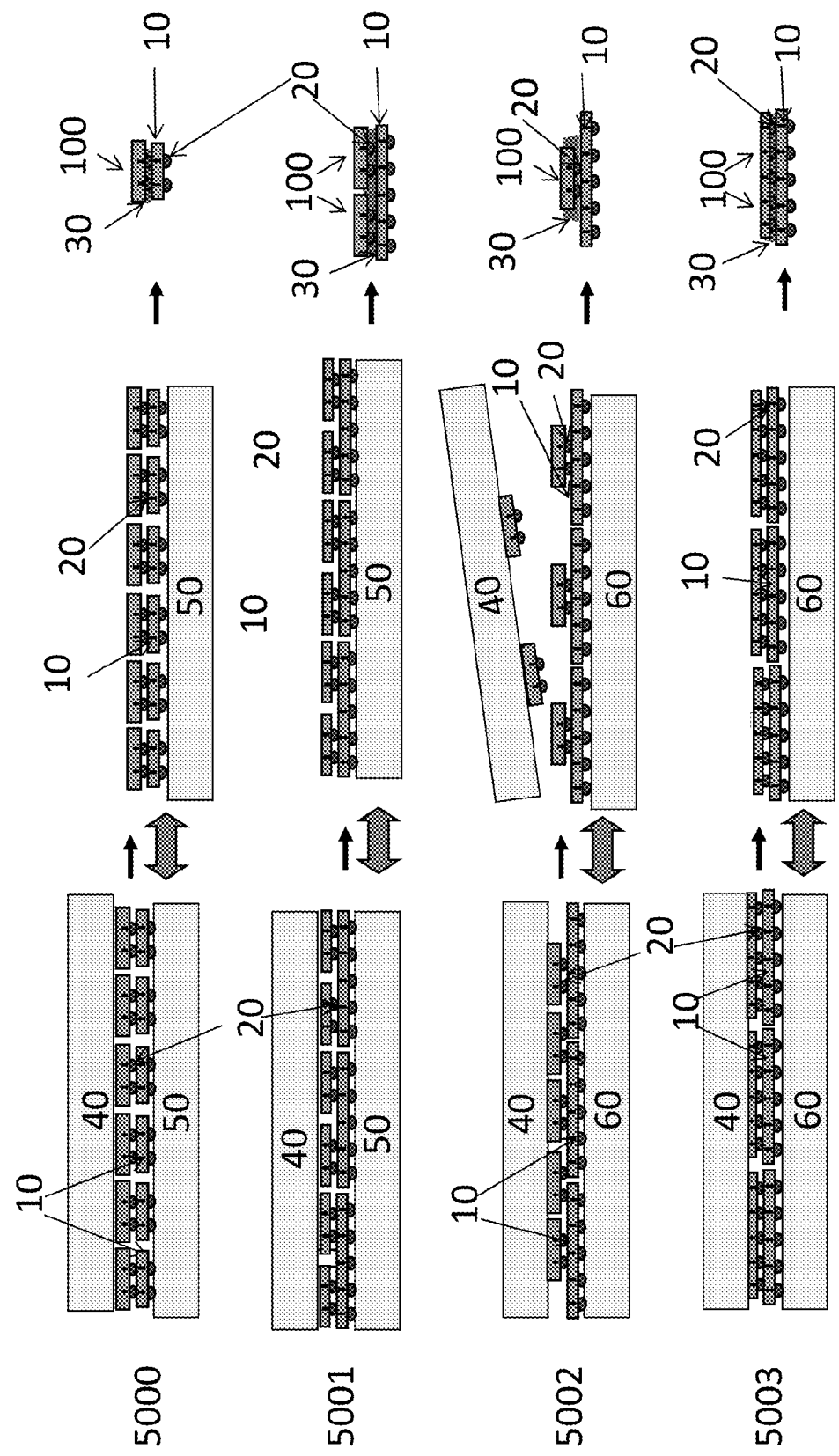
FIG. 3 is a schematic of an assembly die on handle wafer to packages on wafer or panel processing for high volume and small size die and package assemblies.

FIG. 3 is a schematic of an assembly die on handle wafer to packages on wafer or panel processing for high volume and small size die and package assemblies. In process (5000) and process (5001), a first handle wafer (40) and a second handle wafer (50) are used to assemble stacks of thin dies (10). Interconnects (20) are provided for electrical communication between the dies (10). In one step the first handle wafer (40) is removed using, for example, various techniques such as by selective laser ablation combined with proper temporary bonding adhesive as described above. The resulting assembly can be further processed into a 3D package assembly; in this example six die stacks of same size are formed onto the second handle wafer (50). The individual die stack packages can be detached from the second handle wafer (50) to result in a package comprising a bottom die (10), a top die (100), an interconnect (20), and optional underfill (30). Exemplary processes to remove the second handle wafer include those described above.

In process (5002) and process (5003) of FIG. 3, a first handle wafer (40) and a panel (60) are used to assemble package assemblies of thin dies (10). Interconnects (20) are provided for electrical communication between the dies (10). In one step the first handle wafer (40) is removed using, for example, a removal process as previously described above. The resulting assembly can be further processed into a 3D package assembly; in this example three packages are shown attached to the panel (60). The individual packages can be detached from the panel (60) using, for example, the debonding processes described herein to result in a package comprising a bottom die (10), one or more top dies (100), an interconnect (20), and optional underfill (30).

The assembly shown in FIG. 1 and FIG. 2 is carried out systematically to create a plurality of packages containing any number of component types including a microprocessor, a memory die, an energy source (battery), a capacitor, an antenna, and the like.

Those skilled in the art will appreciate that the exemplary structures discussed above can be distributed in raw form or incorporated as parts of intermediate products or end products that benefit from having such devices therein.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   preparing in high volume of chip package assemblies using an area array wafer to panel die stack assembly process to prepare chip package components in high volume;
   wherein the assembly process comprises:
      bonding a handle substrate to a device wafer;
      processing the device wafer to form a processed device wafer comprising dies used to prepare die stacks, the dies comprising top dies and bottom dies, wherein the bonding causes the top dies to be on top of the bottom dies; and
      debonding the processed device wafer from the handle substrate such that certain ones of the top dies are removed.

2. The method of claim 1, wherein the processing is a joining process.

3. The method of claim 1, wherein the processing is an interconnection process.

4. The method of claim 1, wherein the processing is a die singulation process.

5. The method of claim 1, further comprising placing the dies of the die stack by means of self assembly.

6. The method of claim 1, further comprising testing for good dies and using the good dies for the chip package assemblies.

7. The method of claim 1, further comprising performing a self test repair of a die.

8. The method of claim 1, further comprising performing a self test repair of a die stack post package assembly.

9. The method of claim 1, further comprising performing multiple reflow cycles to add multiple dies to a package on panel per reflow.

10. The method of claim 1, further comprising adding one or more layers of die using a handle wafer on one side and a panel on the other sides for the die or a die stack assembly to a package.

11. The method of claim 1, further comprising using a capillary underfill process for joining each layer up to all layers in a die stack or a wafer stack.

12. The method of claim 1, further comprising using a vacuum assisted underfill process for joining each layer up to all layers in a die stack or a wafer stack.

13. The method of claim 1, further comprising using pre-applied underfill to join each layer in a die stack during a joining process.

14. The method of claim 1, wherein the die stacks comprise one or more memory die.

15. The method of claim 1, wherein the die stacks comprise one or more logic die.

16. The method of claim 1, wherein the die stacks comprise one or more Field Programmable Gate Array (FPGA) die.

17. The method of claim 1, wherein the die stacks comprise one or more network die.

18. The method of claim 1, wherein the die stacks comprise one or more antenna layers.

19. The method of claim 1, wherein the die stacks comprise one or more cross bar layers.

20. The method of claim 1, wherein the die stacks comprise one or more photonic layers as a homogeneous or heterogeneous stack.

* * * * *